United States Patent [19] — [11] 3,978,360

Fletcher et al. — [45] Aug. 31, 1976

[54] III–V PHOTOCATHODE WITH NITROGEN DOPING FOR INCREASED QUANTUM EFFICIENCY

[76] Inventors: James C. Fletcher, Administrator of the National Aeronautics and Space Administration, with respect to an invention of Lawrence William James, Santa Clara, Calif.

[22] Filed: Dec. 27, 1974

[21] Appl. No.: 536,785

[52] U.S. Cl. .................................... 313/94; 357/63

[51] Int. Cl.[2] .................... H01J 39/06; H01L 31/10

[58] Field of Search ......................... 313/94, 95, 373

[56] References Cited

UNITED STATES PATENTS

| | | | |
|---|---|---|---|
| 3,408,521 | 10/1968 | Dore et al. | 313/94 |
| 3,694,759 | 9/1972 | Kasaon et al. | 330/4.9 |
| 3,761,837 | 9/1973 | Leheny et al. | 357/63 |
| 3,872,489 | 3/1975 | Hagenlocher | 313/94 X |
| 3,873,382 | 3/1975 | Groves et al. | 357/63 |

*Primary Examiner*—Robert Segal
*Attorney, Agent, or Firm*—Monte F. Mott; Paul F. McCaul; John R. Manning

[57] ABSTRACT

An increase in the quantum efficiency of a III–V photocathode is achieved by doping its semiconductor material with an acceptor and nitrogen, a column-V isoelectronic element, that introduces a spatially localized energy level just below the conduction band similar to a donor level to which optical transitions can occur. This increases the absorption coefficient, $\alpha$, without compensation of the acceptor dopant. A layer of a suitable I–V, I–VI or I–VII compound is included as an activation layer on the electron emission side to lower the work function of the photocathode.

3 Claims, 9 Drawing Figures

III-V PHOTOCATHODE WITH NITROGEN DOPING FOR INCREASED QUANTUM EFFICIENCY

ORIGIN OF THE INVENTION

The invention described herein was made in the performance of work under a contract with the U.S. Department of Transportation and NASA, and is subject to the provisions of Section 305 of the National Aeronautics and Space Act of 1958, Public Law 85-568 (72 Stat. 435; 42 USC 2457).

BACKGROUND OF THE INVENTION

This invention relates to nitrogen doping of III–V photocathode material to increase the photocathode quantum efficiency, and more particularly to nitrogen doping of III-V photocathode material for improved quantum efficiency.

The development of III-V photocathodes has undergone sufficient study for their method of operation to be fairly well understood. In $Cs_2O$-activated III–V photocathodes, a quantum efficiency of 7.5% has been achieved at 1.06 microns. L. W. James, G. A. Antypas, R. L. Moon, J. Edgecumbe and R. L. Bell, Appl. Phys. Letters 22, 270 (1973). The operation (photoemission process) could be broken down into its component parts of electron-hole pair generation and electron transport through each section and across each barrier in the photocathode. Each component part could be treated and optimized separately. The goal would be to combine all of the optimized parts into a photocathode with the highest possible quantum efficiency. However, the present invention treats only one part, namely the electron-hole pair generation.

Although the present invention does treat only one part, brief reference will be made to other parts of the photoemission process in order to place the invention in proper perspective. To facilitate that, reference will be made to exemplary III–V semiconductor materials for a photocathode sensitive to 1.06 micron, although it will be apparent that other materials, particularly materials selected for other wavelengths, can also employ the present invention to advantage. Reference will also be made to particular activation material, but other material may be used for the activation layer.

SUMMARY OF THE INVENTION

An object of this invention is to improve the quantum efficiency of a photocathode by increasing the product of the optical absorption coefficient, $\alpha$, and the diffusion length, L, of III–V photocathode material, and more particularly to increase the below bandgap absorption in order to increase $\alpha$ without an offsetting reduction in escape probability.

According to the invention, a photocathode is made of III-V semiconductor material doped with an acceptor and nitrogen as an isoelectronic element that introduces a spatially localized energy level just below the conduction band similar to a doner level to which optical transistions can occur, thus increasing the absorption coefficient, $\alpha$, without compensation of the acceptor dopant since it is itself a column-V element which goes on a column-V site.

DESCRIPTION OF THE PREFERRED EMBODIMENTS

Figure 1:
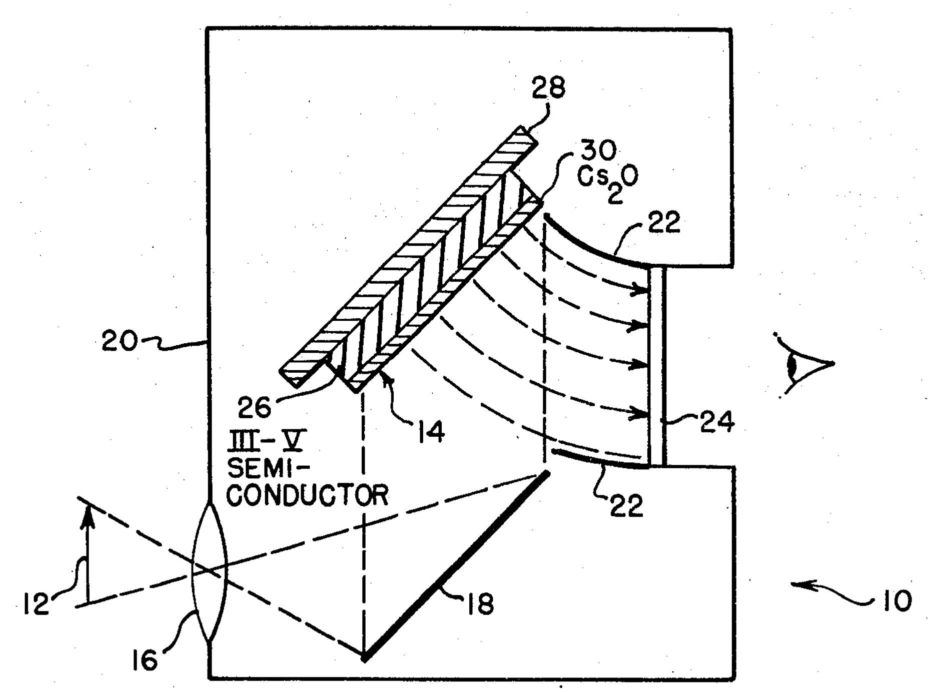
FIG. 1 is a schematic diagram of a $Cs_2O$ activated III–V photocathode in a photodetection device.

Referring now to FIG. 1 there is shown an infrared image intensifier tube 10, representing one of the uses of the present invention. An object 12 to be viewed, gives off or reflects optical radiation in the near infrared spectrum. Rays emanating from object 12 are focused on the photosensitive surface of photocathode 14 through a lens 16 and a 45° mirror 18 disposed within an evacuated envelope 20. Vacuum envelope 20 is preferably evacuated to a suitable low pressure such as $10^{-9}$ Torr. The image of object 12 is reflected from mirror 18 onto photocathode 14 which converts the near infrared image into a corresponding electron image emitted from photocathode 14. The emitted electrons are accelerated by a relatively high voltage such as 30 kv via accelerating electrodes 22, and focused onto a fluorescent screen 24. The optical image appearing on fluorescent screen 24 is greatly intensified image of object 12 and is viewed through fluorescent screen 24 by the eye or a suitable optical pickup device. A reflection optical system is depicted in FIG. 1; however a transmission optical system may be employed with a suitably thin photocathode grown on a suitably transparent substrate.

Photocathode 14 includes a III-V semiconductor 26 supported on a conductive electrode 28. A layer 30 of cesium oxide, $Cs_2O$, is formed on the semiconductor for lowering the work function of the photocathode.

In operation, optical radiation in the rear infrared range and forming the image to be converted, falls onto the emissive surface of photocathode 14 and passes through cesium oxide layer 30 and is absorbed in the semiconductor active layer 26. Upon absorption the infrared radiation produces an electron-hole pair pattern corresponding to the optical image. The electrons drift toward the cesium oxide emissive surface under the influence of the gradient of potential energy developed by bandgap levels in layer 26. The electrons so accelerated pass through the cesium oxide layer 30 and are emitted into the vacuum to form an electron image which is then accelerated to fluorescent screen 24.

Figure 2:
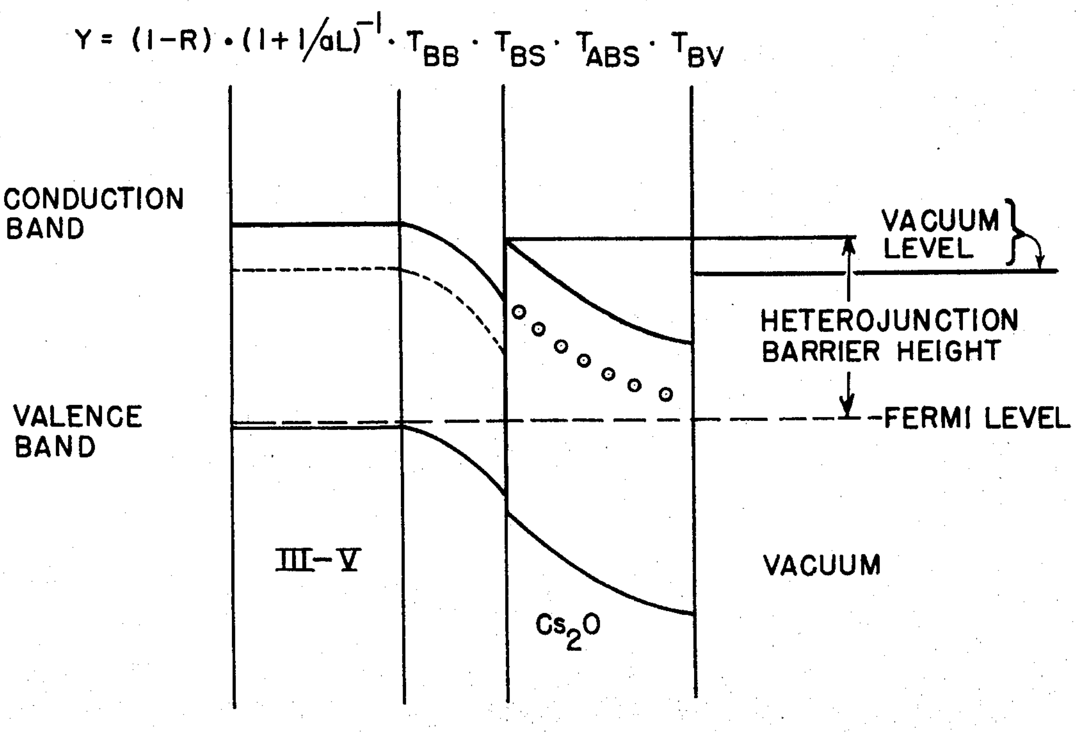
FIG. 2 shows the heterojunction band model for the $Cs_2O$ activated III–V photocathode of FIG. 1 showing each region below a relevant term in an applicable yield equation.

Although the present invention is applicable to different structures employing III–V material and a suitable activation layer, the concept of the invention will best be described with reference to a particular model. The one chosen to characterize III–V photocathodes is a heterojunction shown schematically in FIG. 1 comprised of a III–V semiconductor 26 with an activation layer 30 of $Cs_2O$. An energy band diagram is shown in FIG. 2 for the model.

Referring to the band diagram, $Cs_2O$ is an n-type semiconductor with a 2.0 eV bandgap, a 0.4 to 0.5 eV electron affinity, and a large density of deep (0.2 eV) donor levels caused by excess cesium. The $Cs_2O$ layer and the III–V semiconductor form a heterojunction with band bending in both materials. The band bending in the $Cs_2O$ accounts for an observed parabolic decrease in work function with increasing $Cs_2O$ thickness, assuming that the $Cs_2O$ electron affinity remains approximately constant. (L. W. James, J. L. Moll, and W. E. Spicer, *Proc.* 1968 *Symposium on Ga As*, Conf. Series No. 7, IPPS, London, 1969, P.230). The $Cs_2O$ conduction band at the interface gives an interfacial barrier. The amount of band bending in both the III–V semiconductor and the $Cs_2O$ layer is a function of the surface states at the interface. These surface states will vary from material to material, and even with different crystal orientation or surface preparation methods of the same material. Thus we can expect variations in the heterojunction barrier height.

Figure 3:
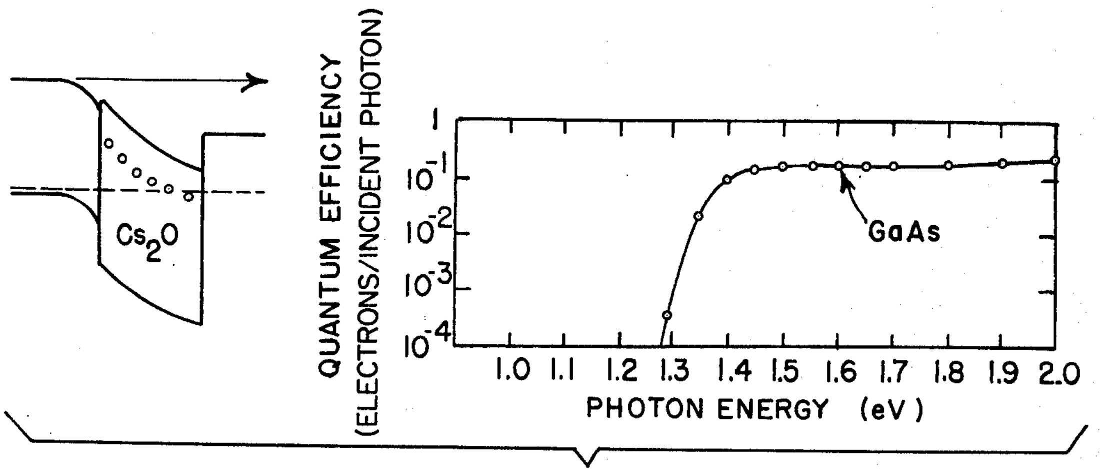
FIGS. 3, 4 and 5 show band diagrams (on the left) and yield curves (on the right) demonstrating the emission mechanisms for semiconductor materials with bandgaps larger than the heterojunction barrier height, with bandgaps slightly less than the heterojunction barrier, and with bandgaps much smaller than the heterojunction barrier height, respectively.
Figure 4:
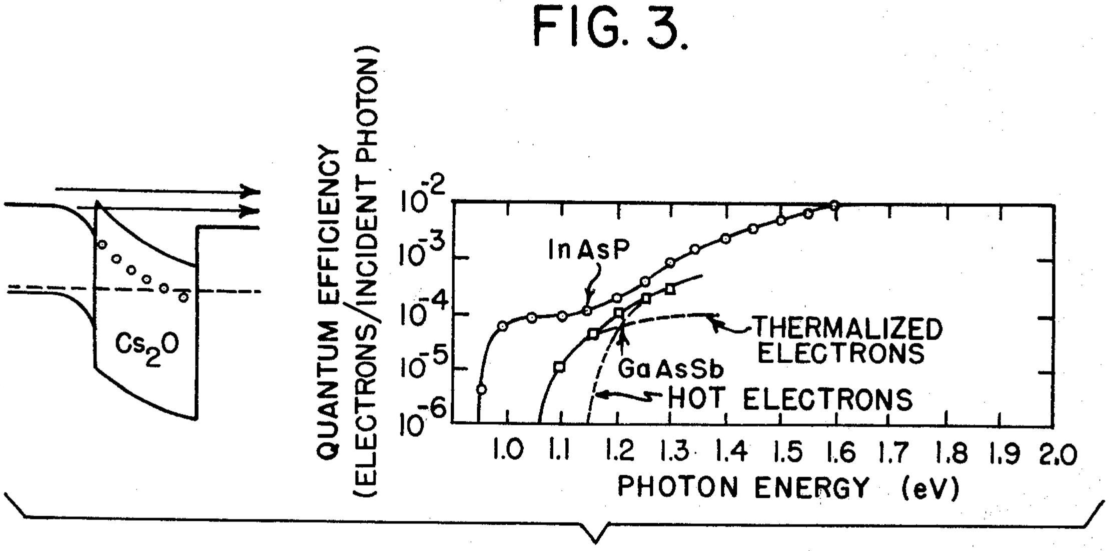
Figure 5:
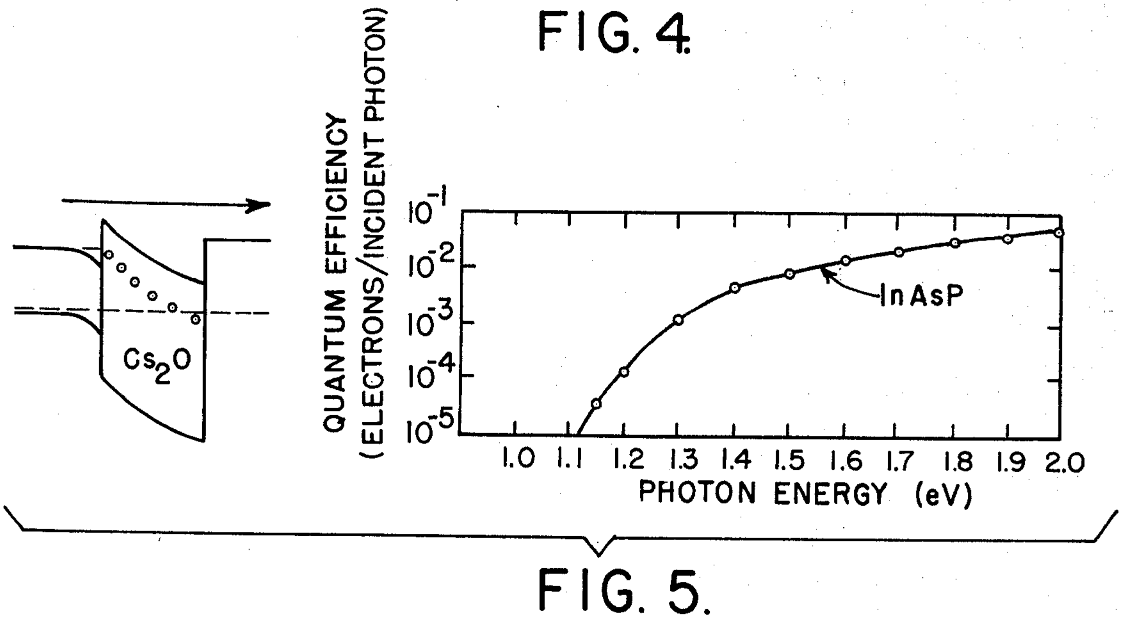

FIGS. 3, 4 and 5 show yield curves which can be expected for photocathodes for which this model is applicable. Each figure shows the heterojunction model band diagram on the left and the yield curve on the right. In FIG. 3 is the model for a III–V semiconductor with a bandgap much larger than the heterojunction barrier height, such as GaAs. Electrons from the GaAs conduction band escape with a high probability over all barriers, resulting in the high yield experimental curve shown on the right.

In FIG. 4 there is shown the model for a semiconductor with a bandgap slightly less than the heterojunction barrier height. Electron emission comes from two processes, thermalized electrons in the lowest conduction band with a low escape probability, and hot electron emission over the barrier with a high escape probability. This is clearly seen in the experimental InAsP yield curve where, for photon energies below 1.15 eV, the yield comes from electrons thermalized in the conduction band with total escape probability of about $10^{-4}$. For photon energies above 1.15 eV, hot electrons are emitted over the barrier with a much higher escape probability, and the yield rises. A yield curve with a very similar shape was obtained by B. F. Williams, Appl. Phys. Letters 14, 273 (1969), on InGaAs, showing clear evidence of a heterojunction barrier on that material. For a III–V semiconductor with a bandgap closer to the heterojunction barrier and/or with a poorer diffusion length as demonstrated by the experimental GaAsSb curve, it can be impossible to see any structure on the yield curve at the heterojunction barrier energy in spite of the fact that there are two components to the yield.

Shown in FIG. 5 is the case for a small bandgap semiconductor such as the 0.6 eV bandgap InAsP sample shown. Electrons thermalized in the lowest conduction band see such a thick barrier that their escape probability is negligible. For photon energies higher than the heterojunction barrier, hot electron emission is responsible for the yield, and the barrier height determines the yield threshold. (There will always be a small yield at lower photon energies due to photoemission from the $Cs_2O$ layer).

The most sensitive 1.06 micron InAsP photocathode operates under the condition of $\alpha L << 1$ with a bandgap approximately 30 meV above the 1.17eV photon energy. This seemingly high band gap material is optimum because of the rapid drop in escape probability with decreasing bandgap in this range, due to the close proximity of the bandgap energy to the barrier height.

The heterojunction model is useful for predicting the magnitude and the shape of the quantum yield curves. The quantum yield near the threshold wavelength of these cathodes is given by the product of several terms numbered 1 through 6 below, each representing a loss of some fraction of photons or electrons:

$$Y = \underset{1}{(1-R)} \cdot \underset{2}{(1 + 1/\alpha L)^{-1}} \cdot \underset{3}{T_{BB}} \cdot \underset{4}{T_{BS}} \cdot \underset{5}{T_{ABS}} \cdot \underset{6}{T_{BV}} \quad (1)$$

This equation is shown in FIG. 2 with each term indicated over the appropriate region of the heterojunction model band diagram. The last four terms are usually combined in one term, the escape probability P.

Of that light incident on the cathode, some fraction R is reflected, giving the first term (1–R). The appropriate reflectivity R is that of the III–V semiconductor, not of the $Cs_2O$ since the $Cs_2O$ layer thickness (< 100 A.) is considerably smaller than the wavelength of the incident light.

Because of the finite minority carrier diffusion length, L, some of the photoexcited electrons will recombine before diffusing to the edge of the band-bending region. The fraction which enters the band-bending region depends on the optical absorption coefficient, $\alpha$, in the form $(1+1/\alpha L)^{-1}$, which is the second term. Thus any increase in $\alpha L$ at 1.17eV will produce a corresponding increase in quantum efficiency, if the escape probability remains constant.

The electron transmission through the band-bending region, $T_{BB}$, is less than unity due to hot electron scattering in this region of the III–V semiconductor. Those electrons reaching the edge of the III–V semiconductor encounter a barrier at the heterojunction. An electron must have a sufficiently large momentum component perpendicular to the barrier in order to have any chance of passing over it. Even those electrons with a sufficiently large momentum component stand some chance of undergoing a quantum mechanical reflection at the barrier. That fraction making it over the barrier is $T_{BS}$.

$T_{ABS}$ accounts for those electrons which are absorbed through scattering, trapping, and recombination while passing through the $Cs_2O$ layer. $T_{BV}$ is the transmission over the work function barrier into the vacuum. As the $Cs_2O$ thickness is increased, $T_{ABS}$ decreases since the electrons have a greater chance of being absorbed when passing through a thicker layer. $T_{BV}$, on the other hand, increases with increasing $Cs_2O$ thickness because the decreasing work function allows increased transmission over the barrier. For any given III–V semiconductor sample, there is an optimum $Cs_2O$ thickness which maximizes the product $T_{ABS} \cdot I_{BV}$. In comparing semiconductors, a larger energy difference between the bandgap and the heterojunction barrier means that the product $T_{ABS} \cdot I_{BV}$ peaks with a thinner $Cs_2O$ layer, and the peak has a higher value.

In order to better appreciate the present invention, it may be helpful to review various tradeoffs involved in optimizing for a given photon energy in terms of a specific example of the state of the art for 1.06 micron, namely Zn-doped InAsP with a quantum efficiency of 2.2% per incident photon. Fitting the data for this cathode to the heterojunction model gives the following values for the terms in the yield equation:

$$(1-R) = 0.71$$

$$(1+1/\alpha L)^{-1} = 0.27$$

$$T_{BB} \cdot T_{BS} = 0.67$$

$$T_{ABS} = 0.24$$

$$T_{BV} = 0.71 \qquad 2.$$

Figure 6:
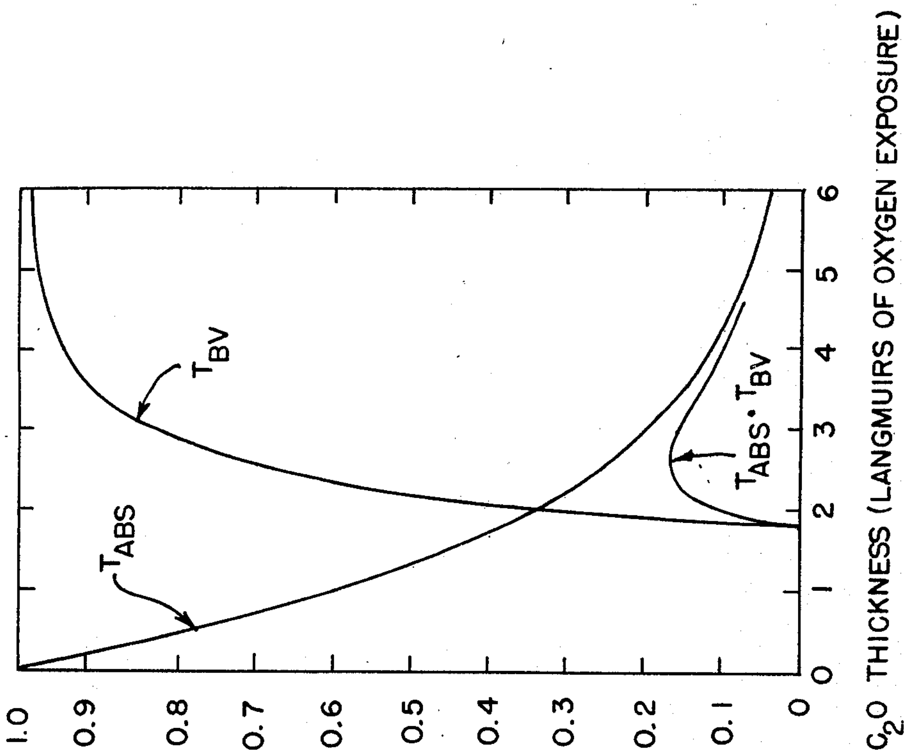
FIG. 6 shows the variation of $T_{ABS}$, $T_{BV}$, and $T_{ABS}\cdot T_{BV}$ with $Cs_2O$ thickness for an InAsP photocathode optimized for 1.06 micron photoemission.

FIG. 6 shows how $T_{ABS}$ and $T_{BV}$ vary with $Cs_2O$ thickness, resulting in a maximum product at the values shown. $T_{BV}$ is zero for a $Cs_2O$ thickness less than 1.7 Langmuirs (microtorr seconds) of oxygen exposure because the work function is higher than the bottom of the conduction band. The number for $(1+1/\alpha L)^{-1}$ looks particularly small for an optimized cathode. It is small in spite of a reasonable diffusion length (approximately 2 microns) because the incident light (at 1.17 eV) is less than the InAsP bandgap (but still in the exciton absorption range) resulting in a very small $\alpha$. However, if the bandgap is lowered to increase $\alpha$, $T_{BB} \cdot I_{BS}$ drops rapidly due to the heterojunction barrier. For example, with a 1.15 eV bandgap:

$$(1-R) = 0.71$$

$$(1+1/\alpha L)^{-1} = 0.50$$

$$T_{BB} \cdot T_{BS} = 0.29$$

$$T_{ABS} = 0.21$$

$$T_{BV} = 0.70 \qquad 3.$$

for a quantum efficiency of only 1.5% per incident photon.

From the model and these examples, it is clear that the largest improvement in 1.06-micron quantum efficiency would be obtained by lowering the heterojunction barrier. With a lower barrier, $T_{BB} \cdot T_{BS}$ would be higher, the required $Cs_2O$ thickness would be reduced raising $T_{ABS}$, and a lower bandgap material could be used, raising $(1+1/\alpha L)^{-1}$. The position of the heterojunction barrier is determined by surface states at the III-V-$Cs_2O$ interface. Various possibilities suggest themselves but it appears that no gain in 1.06-micron quantum efficiency can be obtained by using a crystal face other than the {111B} face.

For III–V semiconductors with a wide range of bandgaps, the heterojunction model correctly predicts the shape and magnitude of the yield curves obtained. This model can be used to evaluate various III–V 1.06-micron photocathodes on a more quantitative basis. Those ternary III–V alloys having bandgaps in the appropriate range are InGaAs, GaAsSb, InAsP, GaAlSb, InAlAs, GaSbP, InSbP, and InAlSb. The two most critical properties to be examined in choosing the optimum material for a 1.06-micron photocathode are the diffusion length, L, and the heterojunction barrier height with $Cs_2O$.

Aluminum-bearing III–V compounds are difficult to work with because of the great affinity of Al for oxygen. As for other materials, other problems present themselves. Thus, of the ternary III–V compounds that may be considered, InAsP emerges as the optimum material to be chosen with current technology, and is likely to remain the optimum ternary material barring future materials developments on InGaAs or InAlAs.

It is quite possible that some quaternary compounds are capable of better 1.06-micron performance than any ternary. The possible quaternaries which have a composition giving a 1.17 eV bandgap are InGaAsP, InGaAlAs, InGaAsSb, InAsPSb, InAlAsP, InAlAsSb, GaAlAsSb, GaAsSbP, InAlSbP, InGaPSb, GaAlSbP, and GaAlInSb. Of particular interest in a InGaAsP having a bandgap of 1.185 eV and a lattice constant closely matching that of InP substrates. Because of the lattice match, such samples are expected to show improved material quality due to the reduction of mismatch dislocations at the interface.

The possible combinations of active layer composition, active layer orientation, and activation layer composition are far too numerous to list in any further detail, but the invention is understood to cover those combinations which may be reasonably derived from this discussion by one familiar with the current state of the art.

The lowest heterojunction barrier height measured for $Cs_2O$-InAsP is 1.1 eV. Activations with other activation layers were tried on InAsP in an attempt to further lower the heterojunction barrier. As yet, nothing shows performance superior to $Cs_2O$.

The best current 1.06-micron photocathodes operate with the 1.17 eV point on the edge of the threshold where the optical absorption coefficient $\alpha$ is small and $\alpha L < 1$. In this region $$\left(\frac{1}{1 + 1/\alpha L}\right) \simeq \alpha L \qquad (4)$$

So an improvement in either $\alpha$ or L will show up directly as an improved 1.06-micron quantum efficiency.

The electron diffusion length L in III–V compounds is determined by $(D\tau)^{1/2}$ where $\tau$ is the minority carrier lifetime and D is the diffusion coefficient. The diffusion length is reduced below its theoretical maximum value for a given doping by excess scattering centers and by recombination processes other than the intrinsic band-to-band process. Inclusion in the semiconductor material of very small amounts of certain impurities such as oxygen or copper can greatly increase scattering or recombination centers and reduce the diffusion length. Even compensation of the material with a donor-type impurity will increase the number of scattering centers. Even if no impurities (other than the Zn dopant) are present, defects in the material such as vacancies or dislocations can act as recombination centers.

In order to obtain the maximum possible diffusion length, the highest quality material possible should be used. The substrate material used should be as free of defects as possible. The liquid epitaxial growth system used should also be as free of oxygen as the state of the art permits. Better cleaning procedures should be employed for the In and the InP substrates used for growth. A regular cleaning procedure for the growth system should be instituted. The result of these efforts toward achieving the highest quality material possible is a significant increase in diffusion length, and hence in 1.06-micron quantum efficiency.

A further increase in 1.06-micron yield would result from any increase in the optical absorption coefficient at 1.06 microns which result in eventual promotion of electrons into the conduction band and which do not change the other cathode parameters. Such an increase in optical absorption coefficient can be obtained by amphoteric doping, that is, by doping simultaneously with p-type and n-type dopants. The dopants will have energy levels several millivolts into the forbidden energy gap from the edges of the conduction and valence band. Optical transitions can take place from both the acceptor level and the valence band to both the donor level and the conduction band. Excitons bound to a donor-acceptor pair can also be created. These additional processes add to the optical absorption coefficient. Excitons can be thermally broken up into holes and free electrons, and electrons in donor levels can be thermally excited to the conduction band, giving free electrons which can then contribute to photoemission.

This possibility to increase the below-bandgap optical absorption by having both donor and acceptor impurities present has been previously demonstrated with GaAs using Si and Ge as amphoteric dopants. However, neither of these dopants produce the desired results in InAsP. Even in GaAs, Ge doping causes a reduction in escape probability.

Figure 7:
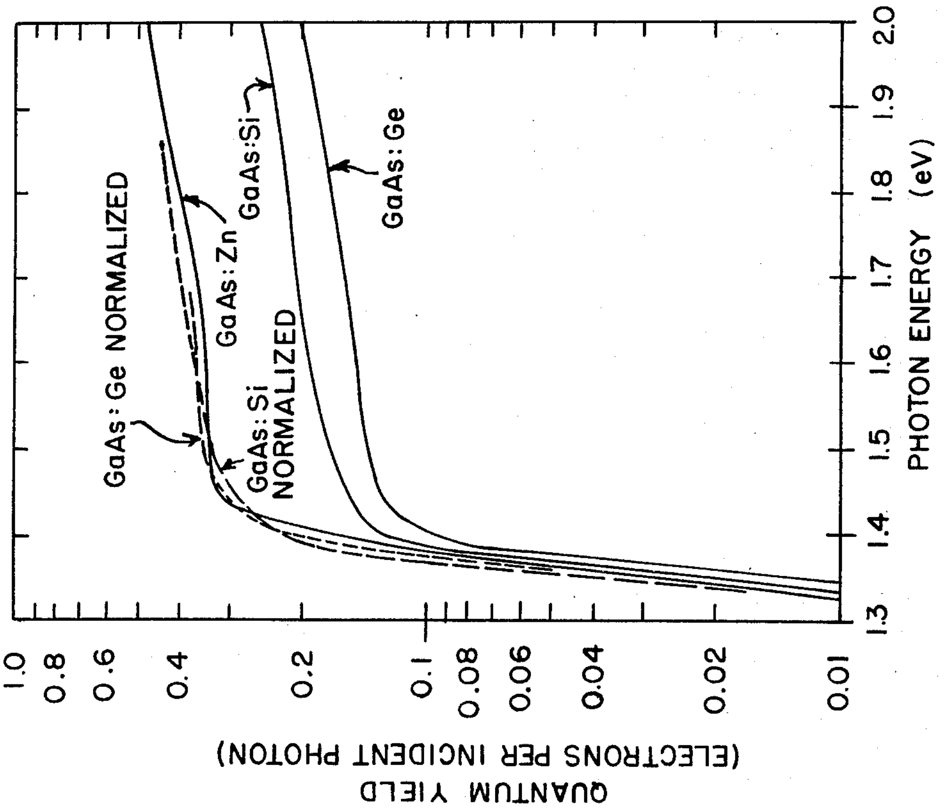
FIG. 7 shows quantum yield curves comparing Zn doping of GaAs with amphoteric doping using Ge or Si.

Using Si and Ge as amphoteric dopants in liquid epitaxial GaAs, the amount of compensation and the total impurity concentration may be varied by varying the growth temperature and the Si or Ge concentration in the melt. FIG. 7 shows a comparison of photoemission measurements on a Zn-doped GaAs sample compared with a Si-doped sample, S. Garbe and G. Frank in *Proc.* 1970 *Symp. on GaAs Related Compounds* (Conf. Series No. 9, IPPS, London, 1971), P. 208, and with a Ge-doped sample, H. Schade, H. Nelson, and H. Dressel, Appl. Phys. Letters 18, 121 (1971). The solid curves are the actual measured photoemission data. The dotted curves for the Si and Ge-doped samples are normalized to the Zn-doped sample's curve at 2.0 eV to show the comparison as if all three samples had nearly the same escape probability. It is not clear whether the lower escape probability observed on the Si-doped and Ge-doped samples is due to the use of those dopants, or to poorer cleaning and activation techniques used by the other experimenters. At least in the case of the Si-doped sample, the second explanation seems likely, as Garbe and Frank report on a Zn-doped sample in the same publication which appears to have an escape probability identical to that of one of their Si-doped samples.

As can be clearly seen from the normalized curves, there is a significant increase in the number of photoexcited electrons in the region of 1.395 eV, 30 meV below the bandgap, in both the Si and Ge-doped samples. As the optimized 1.06-micron InAsP photocathode has a bandgap of 1.2 eV, 30 meV above the desired photon energy, we might expect about a 50% improvement in 1.06-micron quantum efficiency if the amphoteric doping technology could be transferred to InAsP with no loss in material quality or in escape probability.

Figure 8:
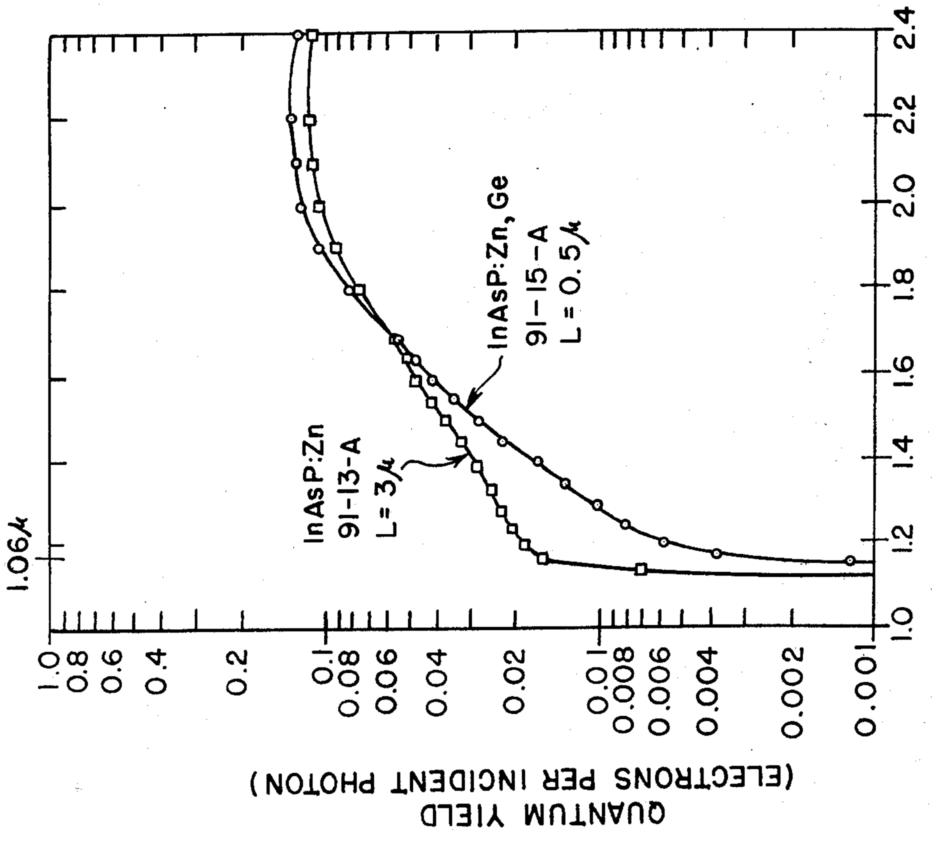
FIG. 8 illustrates quantum yield curves showing the effects on photoemission of the addition of $10^{18}$cm$^3$ Ge donors to $10^{19}$/cm$^3$ Zn-doped 1.2 eV bandgap InAsP.

Experiments were done with liquid epitaxial growth of InAsP from melts containing either Si or Ge. In all cases, the samples were n-type, with the additional complication that Si could not be incorporated into the solid in very large concentrations such as are required for photoemitters. Thus, in order to obtain a compensated p-type InAsP sample, it appears to be necessary to use a p-type dopant such as Zn in addition to Si or Ge. A sample was grown from a melt containing Zn such as to give a Zn acceptor concentration of $10^{18}/cm^3$. The quantum yield curve from the sample grown from this melt is also shown in FIG. 8. Apparently the addition of the Ge caused a large decrease in diffusion length (from 3 to 0.5 micron) which more than cancels the increase in near-bandgap optical absorption.

In accordance with this invention, the absorption coefficient of a III–V semiconductor, such as InAsP and InGaAsP can be increased, with no loss in material quality or escape probability by doping with Zn, Mg or Cd and the isoelectronic dopant N. Nitrogen has the advantage that it introduces a spatially localized energy level just below the conduction band, similar to a donor level, and yet it is itself a column V element which goes on a column V site.

Figure 9:
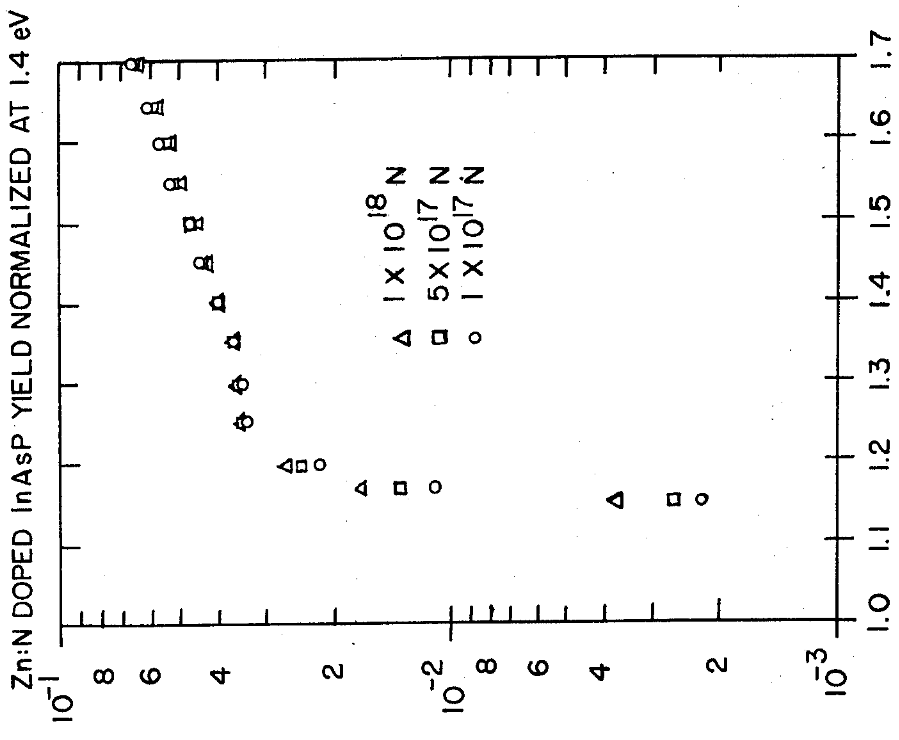
FIG. 9 shows normalized quantum yield curves of three InAsP samples grown from the same melt with increasing N doping concentration.

FIG. 9 shows the photoemission results from three InAsP samples which were grown by liquid epitaxy from a standard melt with $NH_3$ added to the $H_2$ gas flow through the furnace. A fourth sample with an even higher nitrogen concentration gave poorer results. For some unknown reason, the escape probability of all of these samples, including the control sample which was grown first with no nitrogen from the same melt, was lower than optimum. The yield curve of the control sample was nearly identical to that of the "$1 \times 10^{17}$" sample. Thus a 50% increase in $\alpha L$ at 1.06 microns is achieved by isoelectric doping with nitrogen.

When working with ternaries there is always the possibility of a small bandgap shift between consecutive growths which can confuse the picture. In an attempt to eliminate this parameter, we tried N doping a series of GaAs samples. With GaAs the material quality started deteriorating at an N concentration below that at which any beneficial effects on the quantum yield near threshold could be seen. Nitrogen doping in InP, which should behave more like the InAsP, was tried and gave preliminary results similar to the InAsP results, but without any possible bandgap shift.

Although particular embodiments of the invention have been described and illustrated herein, it is recognized that modifications and equivalents may readily occur to those skilled in the art and consequently it is intended that the claims be interpreted to cover such modifications and equivalents.

What is claimed is:

1. A photocathode comprised of a III–V direct bandgap semiconductor material selected from a group consisting of ternary and quaternary compounds that are comprised of a selected one of the following group of paired elements: Ga and As; Ga and Sb; In and As; In and Sb; and In and P, and a deposited layer of activation material forming an emissive surface on said semiconductor material wherein emitted electrons are produced by generation of electron-hole pairs upon absorption of photons by said semiconductor material, said semiconductor material being doped with an element functioning as an acceptor and with an isoelectronic element that introduces a spatially localized energy level just below the conduction band similar to a donor, thus increasing the optical absorption coefficient of said material without compensation of said acceptor dopant, said isoelectronic element being nitrogen and said acceptor dopant being selected from the group consisting of Zn, Mg and Cd.

2. A photocathode as described in claim 1 wherein said semiconductor material is InAsP.

3. A photocathode as described in claim 1 wherein said semiconductor material is InGaAsP.

* * * * *